(12) United States Patent
Lapidot et al.

(10) Patent No.: US 12,266,552 B2
(45) Date of Patent: Apr. 1, 2025

(54) SYSTEM AND METHOD FOR MONITORING SEMICONDUCTOR PROCESSES

(71) Applicant: INFICON, Inc., East Syracuse, NY (US)

(72) Inventors: Matan Lapidot, Kfar Menahem (IL); Mohamed Buhary Rinzan, Manlius, NY (US); Chunhua Song, Jamesville, NY (US)

(73) Assignee: INFICON, INC., East Syracuse, NY (US)

( * ) Notice: Subject to any disclaimer, the term of this patent is extended or adjusted under 35 U.S.C. 154(b) by 80 days.

(21) Appl. No.: 17/909,013

(22) PCT Filed: Mar. 2, 2021

(86) PCT No.: PCT/US2021/020560
§ 371 (c)(1),
(2) Date: Sep. 2, 2022

(87) PCT Pub. No.: WO2021/178464
PCT Pub. Date: Sep. 10, 2021

(65) Prior Publication Data
US 2023/0135167 A1      May 4, 2023

Related U.S. Application Data

(60) Provisional application No. 62/984,516, filed on Mar. 3, 2020.

(51) Int. Cl.
*H01L 21/67* (2006.01)
*C23C 16/52* (2006.01)
(Continued)

(52) U.S. Cl.
CPC ........ *H01L 21/67253* (2013.01); *C23C 16/52* (2013.01); *G01B 17/02* (2013.01);
(Continued)

(58) Field of Classification Search
CPC .. G01B 17/02; G01N 29/041; G01N 29/2443; G01N 29/2462;
(Continued)

(56) References Cited

U.S. PATENT DOCUMENTS

2002/0152803 A1   10/2002   Larson, III et al.
2006/0144335 A1   7/2006    Lee et al.
(Continued)

FOREIGN PATENT DOCUMENTS

JP    2011-514660    5/2011
JP    2019-510374    4/2019
(Continued)

OTHER PUBLICATIONS

PCT/US2021/020560; filed Mar. 2, 2021; International Search Report and Written Opinion; date of mailing Jul. 8, 2021 (16 pages).
(Continued)

*Primary Examiner* — John Kim
(74) *Attorney, Agent, or Firm* — Barclay Damon LLP

(57) ABSTRACT

A system and method for monitoring a semiconductor process includes a plurality of sensors and a microcontroller. The plurality of sensors are disposed within a process
(Continued)

chamber. The microcontroller receives data from the plurality of sensors and measures the uniformity of a semiconductor process based on the data received from the plurality of sensors.

26 Claims, 5 Drawing Sheets

(51) Int. Cl.
  *G01B 17/02* (2006.01)
  *G01N 29/04* (2006.01)
  *G01N 29/24* (2006.01)
  *H01J 37/32* (2006.01)
  *H01L 21/66* (2006.01)

(52) U.S. Cl.
  CPC ....... *G01N 29/041* (2013.01); *G01N 29/2443* (2013.01); *G01N 29/2462* (2013.01); *H01J 37/32963* (2013.01); *H01L 21/6719* (2013.01); *H01L 22/26* (2013.01); *G01N 2291/0231* (2013.01); *G01N 2291/02854* (2013.01); *G01N 2291/0423* (2013.01); *G01N 2291/0426* (2013.01); *H01J 2237/24465* (2013.01); *H01J 2237/24585* (2013.01); *H01J 2237/3321* (2013.01); *H01J 2237/334* (2013.01)

(58) Field of Classification Search
  CPC ... G01N 2291/0426; G01N 2291/0231; G01N 2291/02854; G01N 2291/0423; H01J 37/32963; H01J 2237/24465; H01J 2237/24585; H01J 2237/3321; H01J 2237/334; H01L 21/6719; H01L 21/67253; H01L 22/26; C23C 16/52
  See application file for complete search history.

(56) References Cited

U.S. PATENT DOCUMENTS

| | | | |
|---|---|---|---|
| 2008/0098815 | A1 | 5/2008 | Merassi et al. |
| 2010/0316788 | A1 | 12/2010 | Dieguez-Campo et al. |
| 2014/0053779 | A1 | 2/2014 | Martinson et al. |
| 2016/0264401 | A1 | 9/2016 | Liukku et al. |
| 2018/0057356 | A1* | 3/2018 | Tedeschi ............... B81B 7/0058 |
| 2019/0096641 | A1 | 3/2019 | Wong et al. |

FOREIGN PATENT DOCUMENTS

| | | |
|---|---|---|
| JP | 2019-528575 | 10/2019 |
| KR | 20100106608 A | 10/2010 |
| KR | 1020190039317 A | 10/2019 |

OTHER PUBLICATIONS

EP 21764230.5; filed Mar. 2, 2021; Extended European Search Report; date of mailing Mar. 26, 2024 (10 pages).

Japanese Patent Office; Notice of Reasons for Rejection; Apanese Patent Application No. 2022-552971; Transmission Date: Nov. 19, 2024; (3 pages).

Japanese Patent Office; Notice of Reasons for Rejection; Apanese Patent Application No. 2022-552971; Transmission Date: Nov. 19, 2024; (3 pages) English Translation.

Korean Patent Office; Office Action; Korean Application No. 10-2022-7034291; Dated: Feb. 6, 2025; 46 pages.

* cited by examiner

SYSTEM AND METHOD FOR MONITORING SEMICONDUCTOR PROCESSES

RELATED APPLICATIONS

This application is a national stage application pursuant to 35 U.S.C. § 371 of International Application No. PCT/US2021/020560, filed on Mar. 2, 2021, which claims priority to, and benefit of, U.S. Patent Application No. 62/984,516, filed Mar. 3, 2020, the entire contents of which are hereby incorporated by reference.

BACKGROUND

Deposition and etch processes at semiconductor manufacturing plants are widely and commonly being used during device fabrication in the semiconductor integrated circuit (IC) industry. The semiconductor industry efforts to reduce the dimensions, which traditionally were limited by the lithography resolution of 2-dimensional structures, are shifting to deposition and etch process control of 3-dimensional structures (for example, 3D gate and 3D NAND). Device critical dimensions are impacted more and more by the ability to control deposition and etch processes. With that being said, new technologies to allow tighter process control at etch and deposition processes are needed.

Plasma etch processes are often used to remove dielectrics, semiconductors, or metal layers by an ignition gas at a plasma state (which drive the activation energy of the chemical reaction). The material removal can also be performed by flowing reactive gases (in a non-plasma state) or through wet etch (at liquid state) stations. Deposition of films over the chamber components and the processed substrates can be applied by various methods like Plasma enhanced (PE) chemical vapor deposition (CVD), Sub atmospheric CVD, Thermal CVD, Atomic layers deposition (ALD), Plasma-enhanced atomic layer deposition and more. Etch and deposition processes can be isotropic or anisotropic (like Reactive Ion etching—RIE) depending upon the process step.

In substrate deposition processes, such as IC fabrication processes, deposition of many different layers over the wafer (which is the substrate) can be achieved through different reactions and various process matter states. Example technologies include plasma (PECVD and high density plasma—HDP), gas—sub-atmospheric CVD (SACVD) and liquid (electroplating). Some of the examples for key parameters to control the deposited layers and the device fabrication characteristics are: thickness, stress, mass, resistance, particles and refractive index. Those parameters are measured and controlled, not just for the mean value (over a wafer or a batch of wafers), but also wafer variability and interstitial wafers variability. Reducing the process variability contributes to the improvement of the manufacturing yield at the end of line (EOL) process.

For example, the following steps are used in substrate etching: wafer etching steps to apply patterns (in conjunction with lithography steps) to the manufactured device; cleaning the wafers from contamination; creating trenches between transistors; enabling separation between contacts and isolators; reacting the wafers surface before deposition and for removal of photo resist. Key parameters to control the etch process over the wafers are: critical dimensions for the defined features, such as etch rate, thickness, stress, particles and defect control and other electrical and optical parameters.

Substrate etch and deposition may or may not be simultaneous processes (for example, in some of the HDP processes, etch and deposition may occur consecutively or concurrently) in the same process chamber, consecutively in the chamber, non-sequentially in the chamber or in different chambers.

During a substrate deposition sequence, by-products from the process can be deposited over the chamber component. This process might be non-uniform (different at different chamber locations) depending on the process step or condition. Chamber deposition between substrate deposition takes place while there are no substrates inside the process chamber. This deposition, which coats the chamber components, (sometimes called "undercoat", "precoat", "seasoning," etc.) produces enhanced wafer uniformity and control. Some examples of between-substrate depositions which impact the wafer process are: better particle performance over the wafers by "sticking" the particles with an undercoat layer, better wafer process uniformity by applying a precoat layer to the chamber components, and improved control of the deposition rate by seasoning the chamber.

Chamber etch (between the substrate etch/clean processes) occurs when there are no substrates inside the chamber to remove the coating from the chamber components and to clean the chamber from by-products. This process augments particle performance and process control. In this process, materials are etched from the chamber components.

Some of the process steps, before or after the deposition step (over the wafers), may include pre- or post-treatment to etch the wafer surface. For example, pretreatment (before deposition) involves removal of contaminants from the wafer surface so as to facilitate better adhesion of the deposited layer, and post-treatment to anneal, or to "shrink", the deposited layer. During those processes, by-products removed from the substrates may stick to, and deposit, the chamber components and/or etch different chamber components. For example, during plasma pretreatment of the substrate, by-products may be deposited on the chamber wall but removed from the chamber chuck (where the wafer is seated).

Post-maintenance deposition and etch, including post preventive or reactive maintenance of the process chamber, deposition and etch cycles with, and/or without, substrates would apply to allow better particle performance, process uniformity (within or/and between substrates), process control and rate control. In this process, by-products may be deposit or removed (etched) from different chamber components.

During wafer deposition and etch, cross impact between different components within the chamber and along the substrate may accrue, due to process parameters, e.g., flows, local temperature, plasma density, pressure etc., and change as a result of the condition of the chamber components. The cross impact influences both the conditions of the substrate and chamber processes (etch or deposition over the chamber components).

One example of cross impact between chamber components and processed substrate includes a substrate processed through a clean chamber (no deposition prior to the substrate entrance.) The deposition rate and thickness uniformity over the substrate may be different compared to a substrate processed in a chamber that already includes coating material, e.g., pre-seasoning.

Another example of cross impact relates to hard-mask gate etching where the by-products accumulated on the chamber wall impact the etch rate and critical dimensions over the substrates.

Other forms of cross impact include the accumulation film on the chamber walls, wherein the film stress is accumulated to a level where the film is cracked, inducing the flaking of particulate and contamination of production wafers. This adversely impacts production yield and limits the accumulation window of wafer production. A plasma clean process must then be used to clean the residue from the process chamber.

The term of local and direct process measurement using a QCM relates to a method wherein the mass added to, or removed from, the QCM surface changes the QCM frequency (described in a Sauerbrey equation for correlating changes in the oscillation frequency of a piezoelectric crystal with a mass deposited on its surface). Though the film stress impact isn't explicitly described by a basic Sauerbrey equation, it will impact the QCM frequency and can impact the effective shear modulus. The term "direct measurement" of a QCM involves the measurement of film deposited or removed from the crystal surface of the piezoelectric crystal. The term "local measurement" of the QCM means the measurement of the film deposited locally, or proximal to, a specific location.

Some of the known methods for process monitoring using integrated sensors include: mass spectrometers, optical spectrometers, RF sensors, and vacuum gauges. Such methods are, however, not localized and fail to give detailed information regarding the accumulated or removed film at different chamber locations. One example of non-localized process control includes a plasma-clean method like optical emission spectrometry, residual gas analyzers and chamber impedance measurement. All of these methods, however, measure convoluted signals from the entire chamber and do not identify the uniformity or homogeneity of the process materials at different chamber locations. Other known sensors, like temperature sensors, may be localize and read measurements along the surface of various chamber components but will not provide detailed information regarding the film conditions associated with coating these surfaces.

U.S. Patent Application Publication No. 2012/0201954 (Wajid) discloses a QCM that provides information regarding film coating or etch, but employs a single location which fails to provide information regarding the uniformity or homogeneity of the process at different chamber locations. Therein, the accuracy and value of the process data decreases as the size of the chamber increases.

U.S. Patent Application Publication No. 2014/0053779 (Martinson, et al.) describes a QCM probe which moves between different chamber locations. This solution, however, is limited to a research lab, and only compatible with a production environment wherein a vacuum is needed for production. In addition, this solution does not facilitate simultaneous monitoring of QCM sensors at different chamber locations.

Accordingly, there are no direct, localized approaches for process uniformity/homogeneity monitoring inside the Chemical Vapor Deposition (CVD) and etch chambers.

BRIEF SUMMARY OF THE DISCLOSURE

Therefore, in one embodiment of the disclosure, a system is provided for monitoring a semiconductor process. The system comprises a plurality of sensors and a microcontroller wherein the plurality of sensors are disposed within a process chamber at various predetermined locations. The microcontroller receives data from the plurality of sensors and measures uniformity of the semiconductor process based on the data received from the plurality of sensors. At least one of the sensors defines an angular orientation which is different from the angular orientation of another sensor. In yet another embodiment, at least two of the sensors each include a sensor surface defining an angular orientation wherein the angular orientation of one sensor surface is different than the angular orientation of another sensor surface.

In another embodiment of the disclosure a system is provided for monitoring a semiconductor processes, comprising a plurality of sensors selectively arranged within a process chamber and configured to issue process signals indicative of a material process occurring proximal to each of the plurality of sensors. A first and second sensor defines first and second spatial positions within the process chamber, respectively, wherein the first spatial position has a different angular orientation than the second spatial position. A microcontroller is responsive to the process signals to correlate the material process sensed by the first and second sensors with a semiconductor process occurring within the current process chamber. The sensors acquire information useful for conducting semiconductor processes performed within one of the current process chamber and a related process chamber.

In yet another embodiment, a method is provided for monitoring a semiconductor process. The method includes the steps of: placing a plurality of sensors within a process chamber at different locations within the process chamber and measuring the deposition or removal of process material from a substrate disposed within the process chamber. A first sensor of the plurality of sensors have a first angular orientation and a first position in the process chamber and the second sensor of the plurality of sensors have a second angular orientation and second position in the process chamber. The method also includes the steps of: monitoring the deposition or removal of process material at different locations within the process chamber and measuring the uniformity of the semiconductor process based on data received from the plurality of sensors during the monitoring step. The first angular orientation and first position of the first sensor and the second angular orientation and second position of the second sensor facilitates measuring the uniformity of the semiconductor process.

In yet another embodiment, a method is provided for monitoring semiconductor processes in a process chamber comprising the steps of: (i) providing a baseline substrate having thickness profile which meets an acceptance profile; (ii) placing a plurality of sensors within a process chamber to measure material process data occurring proximal to each of the plurality of sensors; (iii) correlating the measured material process data with a thickness profile of a test substrate produced within the process chamber; (iv) comparing the thickness profile of the test substrate with the baseline substrate to determine whether the test substrate is satisfied by an acceptance criteria established by the acceptance profile of the baseline substrate; (v) recording the measured material process data of the sensors when the acceptance criteria of the test substrate has been satisfied; and (vi) processing a subsequently fabricated substrate in accordance with the recorded material process data.

The above embodiments are exemplary only. Other embodiments as described herein are within the scope of the disclosed subject matter.

BRIEF DESCRIPTION OF THE DRAWINGS

So that the manner in which the features of the disclosure can be understood, a detailed description may be had by reference to certain embodiments, some of which are illustrated in the accompanying drawings. It is to be noted, however, that the drawings illustrate only certain embodiments and are therefore not to be considered limiting of its scope, for the scope of the disclosed subject matter encompasses other embodiments as well. The drawings are not necessarily to scale, emphasis generally being placed upon illustrating the features of certain embodiments. In the drawings, like numerals are used to indicate like parts throughout the various views, in which.

Corresponding reference characters indicate corresponding parts throughout several views. The examples set out herein illustrate several embodiments, but should not be construed as limiting in scope in any manner.

DETAILED DESCRIPTION

Figure 1A:
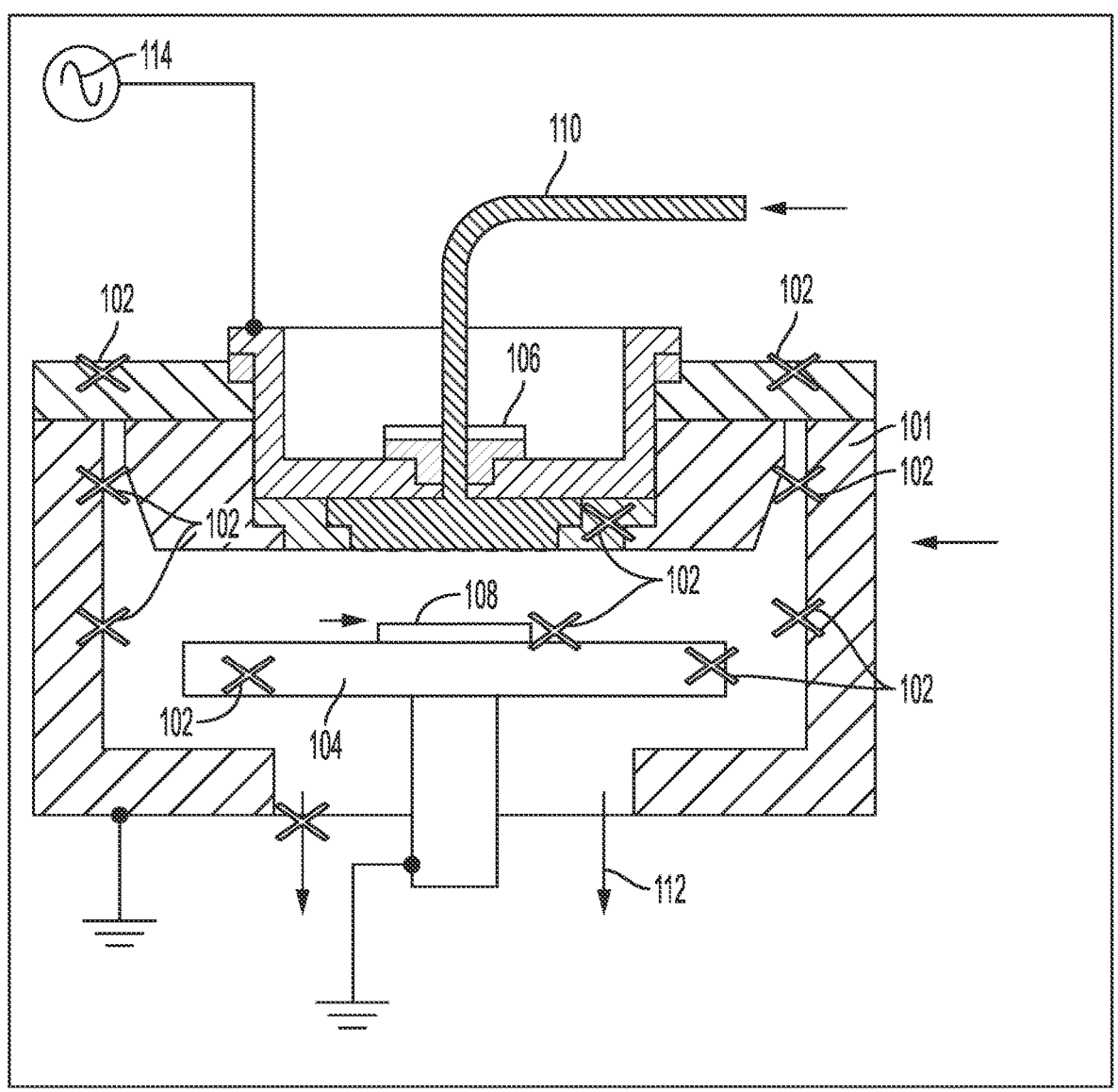
FIGS. 1A and 1B depict chambers for semiconductor processing, in accordance with one or more aspects set forth herein.

The present disclosure relates to the field of semiconductor fabrication, including semiconductor fabrication control. More particularly, in one example, a sensor system monitors semiconductor fabrication process tools, specifically monitoring direct in chamber process homogeneity at deposition and etch processes. For instance, disclosed herein is a unique method for direct thin film deposition and etch measurement using a sensor which allows locally monitoring the process homogeneity at one or more locations inside the process chamber. This provides insight regarding the local cross impact between the substrate and different chamber parts condition. Advantageously, deploying sensors at different chamber locations will allow measurement of different film properties (mass density and stress), due to the non-homogeneity of the process (deposition and/or etch) inside the process chamber.

Many different types of sensors may be employed in the present disclosure. For example, Quartz Crystal Microbalance (QCM) sensors or microelectromechanical (MEM) sensors may be deployed. One example of a MEM sensor for use in the present disclosure is a surface acoustic wave sensor. A person of ordinary skill in the art would readily understand how QCM and MEM sensors are made and used. The present disclosure makes use of a variety of such sensors positioned at different locations in the process chamber. In any embodiment that discusses a QCM sensor, any other sensor, such as a MEM sensor, may be employed.

Combinations of any of the following sensor types may be used as a sensor in one or more embodiments: capacitor sensors, photocathodes, photo detector sensors, micro machined ultrasonic transducers, oscillator devices configured to measure energy or mass changes, resonance electro/optical devices, resistance measurement sensors, sensors having a dielectric waveguide in contact with a metallic layer or a metallic pattern suitable to generate a Plasmonic reaction, light emitting devices, electron beam sources, ultrasonic sources, optical resonators, micro-ring resonators, photonic crystal structure resonators, temperature sensors.

In one embodiment, a system uses the local sensitivity of Quartz Crystal Microbalance (QCM) sensors to perform deposition and etch processes (adding or removing mass or/and film stress over or from the QCM) which employs the resonance frequency of the crystals (at known process conditions). One embodiment of the present disclosure can also use QCM sensors to monitor process conditions like temperature, flows, pressure, etc., at a known accumulation of thickness and stress to monitor the local process conditions. Instead of a QCM sensor, a MEM sensor could be used in the same manner.

By the use of QCM sensors at different locations inside a process chamber while sampling the QCM sensors during different processes sequences (for example different deposition and etch steps) important information reflecting real time process homogeneity of the chamber can be obtained. Instead of a QCM sensor, a MEM sensor could be used in the same manner.

The above process can be used in multiple chambers to implement chambers and tool matching and can be used for process variation monitoring (between chambers and tools). Another benefit relates to the shortening of time to bring a particular process chamber into production, by measuring the deposition rate using multiply sensors. Wafer edge uniformity can also be obtained by using multiple sensors over the chamber radius around the wafer edge. Process homogeneity for different sequences inside an HDP deposition chamber may include: precoat deposition homogeneity, wafers deposition homogeneity, plasma clean homogeneity monitoring etc.

Measurement of process homogeneity can be obtained by measuring the QCM frequency value starting at the beginning of a deposition sequence and ending with a plasma clean sequence (for a given production recipe.) Furthermore, the difference or delta in frequency, end to start, between different runs can give information regarding process stability at a given location.

Another example of process homogeneity measurement relates to the frequency difference between the beginning and the end of wafer deposition between different wafers (for the same recipe). A specific correlation parameter or equation (based on the QCM location) can be then calculated to predict the wafers thickness and thickness variability. This may help to avoid using test wafers for thickness measurement, or can be used as feed forward or backward information to control different process operations prior to, or after, substrate deposition. Instead of a QCM sensor, a MEM sensor could be used in the same manner.

Process homogeneity can also be measured by taking the maximum frequency during plasma clean from different QCM locations, which allows the user to know if a film is being accumulated under etch or over etched at a specific location. An algorithm for determining a process end point can use frequency information from multiple QCM sensors dispersed in different locations and can be used to optimize the process end point (EP) of the clean. For example, one can monitor the moving average of the frequency derivative until a threshold is reached, i.e., when the end point of the clean is reached, the derivative of the frequencies becomes much lower. For example, this over etch or under etch for different parts can be reached or achieved intentionally. The same, or similar approach, can be applied to other time-based processes using materials addition or removal, like undercoat, precoat, etc.

Endpoint detection of wafer-based processes such as deposition, etch, densification, and contaminations removal, using plasma or heat (pretreatment or bake out) can also be realized using signal inputs from multiple QCM sensors dispersed at different locations. QCM sensors at different locations inside the process chamber can measure different deposition and etch rates to give information regarding the process uniformity, for example, in the case of a plugged nozzle (at HDP chamber), a QCM closer relating to this specific nozzle can measure different process rates. Instead of a QCM sensor, a MEM sensor could be used in the same manner.

In addition, by implementing at least two QCM sensors each having a different angular orientation (relative to the wafer plane), the process rate at different angles over the wafer can be measured and/or calculated to give three dimensional information regarding the process and process rate in the wafer plane. Also, by applying a variable DC bias to the QCM with respect to chamber ground, deposition to sputter ratio on the wafer can be produced over the QCM with a tooling factor.

Control of process uniformity is the key for integration different processes and has a direct impact over die yield. FIG. 1A depicts a chamber 100 for semiconductor processing, e.g., a PECVD chamber. Multiple QCM sensors 102 are deployed at various positions within or near the chamber 100, e.g., sidewalls, bottom, or top. A heated table 104 supporting a substrate 108 (i.e., wafer) is deployed within the chamber, and one or more QCM sensors 102 may be deployed in the heated table 104. The chamber 100 includes a top electrode 106 and a gas inlet 110, again which may be monitored by additional QCM sensors 102. Next, the chamber includes pumps 112 to remove the process gas, and those pumps 112 may also be monitored with an additional QCM sensor 102. Although this specific example uses a QCM sensor, a MEM sensor could be used in the same manner.

Figure 1B:
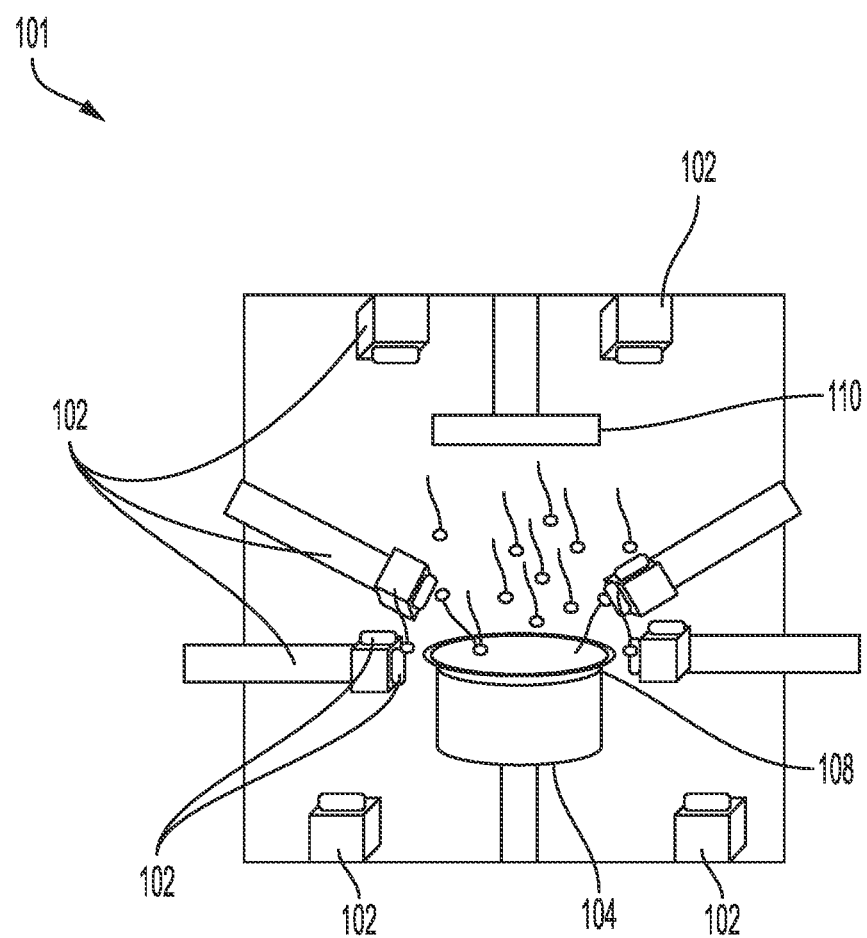

FIG. 1B depicts another chamber 101 for semiconductor processing. In the embodiment of FIG. 1B, multiple QCM sensors 102 are deployed at different locations in the process chamber and at different positions and or different angles relative to the substrate. Advantageously, the multiple QCM sensors 102 allow for process (and process rate) homogeneity monitoring inside different locations over the process chamber and at different chamber parts. Based on the data collected from the multiple QCM sensors 102, the process may be optimized and process homogeneity issues may be detected inside the process chamber. For example, the system allows for process and process rate monitoring and control over the substrate, due to the use of multiple QCM sensors 102 at different angles and positions. In addition, a 3D map of the process homogeneity can be produced using the data. Although this specific example uses a QCM sensor, a MEM sensor could be used in the same manner.

Figure 2:
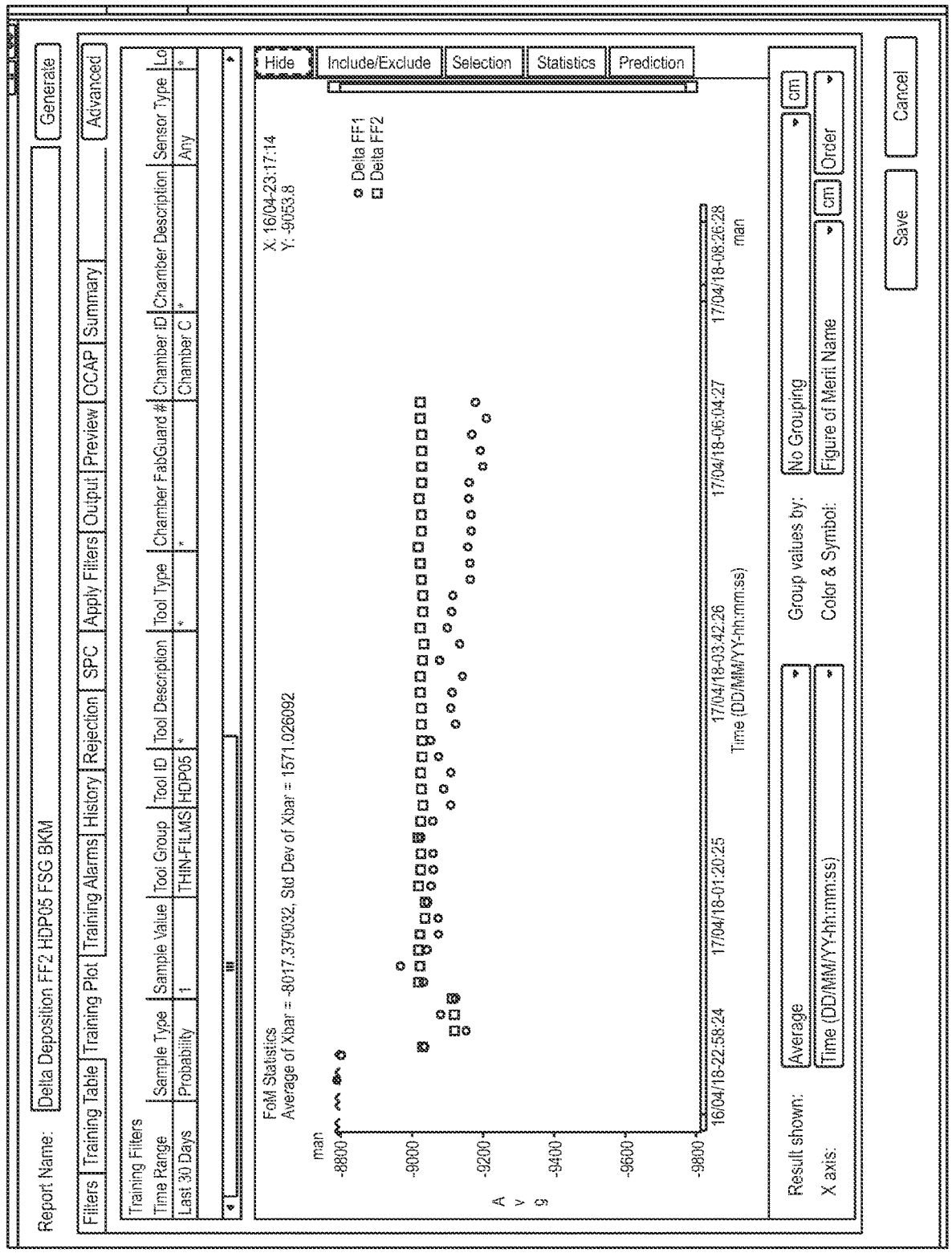
FIG. 2 depicts measurements from a plurality of sensors disposed within a process chamber, in accordance with one or more aspects set forth herein.

As depicted in FIG. 2, the deposition (or delta of the Fundamental Frequency over a wafer) measured by two differently located QCM sensors (inside the deposition chamber) is different for wafer-to-wafer variations. While sensor 2 (FF2) data is stable wafer-to-wafer, sensor 1 reflects higher process variations wafer-to-wafer.

For example, a chamber wall clean endpoint may be determined by a single QCM sensor in the chamber. The different clean recipes are expected to clean the chamber wall to its end point. Disadvantageously, the use of a single QCM does not adequately determine the cleanliness of the entire chamber wall. It will be appreciated that, the active area of the QCM is very small as compared to the large, dispersed, chamber wall area. Therefore, several QCM sensors can be used in selected locations to fairly represent the average chamber clean condition. This is not only helpful in concluding that the chamber wall is sufficiently clean, but that the slope of the etch frequency can be used to understand the etch rate non uniformity which then can be used to bring the chamber into an acceptable condition.

Another advantage of using multiple sensors relates to determining the correct trade-off between under-etch and over-etch conditions. For example, non-homogenous etch inside a chamber can over clean a part of chamber and leave some other part not cleaned fully, causing constant chamber wall over etching (turning chamber materials in to particles) or/and incremental film build up (eventually leading to stress relieving flake-off of particles). Therefore, by having several QCM sensors, the information can be used regarding such non-homogeneity in-real time. Further, the process may be modified to produce a satisfactory compromise until a permanent solution is found. This also helps to tweak a given chamber to the condition of a golden chamber.

One embodiment of the present disclosure employs a system comprising a plurality of QCM sensors to monitor, learn and control real time chamber process homogeneity. This system also provides insight regarding the cross impact between the substrate processing (etch and deposition) to different chamber part locations at different or the same time stamp. By monitoring different chamber locations at the same time stamp, the process homogeneity may be measured (by comparing the QCM signal at different locations.) By monitoring the QCM at different process sequences (for example: undercoat, deposition, etch, clean etc.), the process homogeneity can be monitored for each process sequence or for subsequently processed processes in different process chambers.

One embodiment of the present disclosure allows homogeneity monitoring of deposition and etching for a stack (more than one layer) of layers that may consist of different materials, different layers stress and different densities. One example includes multi layers of Oxide over Nitride stack deposition used in the 3D NAND technology. Today, there is no direct measurement to allow in situ process control. The usage of QCM sensors in multiple locations within the stack deposition chamber allows real time monitoring. The QCM data can be feedback into the recipe as a process parameters, for example, the deposition time for a single layer in the stack can be modified in real-time based on the QCM sensors data.

The system of the present disclosure can be used in multiple chambers to compare and to achieve better chamber matching to reduce the overall process variability. The plurality of the sensors provides the benefit of verifying the repeatability of homogeneity between wafers, spatial homogeneity for a given wafer. The data also allows homogeneity analysis across steps (for the purpose of root cause analysis) by binning the frequency shifts to understand what specific steps across process steps causes a variance.

In one example, the system comprises a plurality of single or dual QCM sensors mounted at judiciously selected locations on the process chamber to monitor changes in deposits and/or etch of thin films on the chamber wall in the close proximity to the respective sensors. Such conditions may include, among other things, mass, stress, density and or materials composition over the QCM sensors. The QCM data can also be used to relate other process conditions (flows, pressure, temperature, plasma uniformity, etc.), as those changes will impact the measured QCM fundamental frequency (at different harmonics) and possibly the fundamental frequency rate of change. Although this specific example uses a QCM sensor, a MEM sensor could be used in the same manner.

In such a case, software communicates with the process tool and with the QCM sensors. The SW will possibly receive, from the process tool, logistic information such as production recipe name, lot ID, slot ID, wafer ID (WID), sequence ID etc., in addition other variables like, step number, RF power, pressure etc. The combination of the tool data and the QCM sensors will allow measuring the local process homogeneity between and within different process steps.

In another example, the software may communicate with multiple chambers in the same process operation, the comparison and matching between different chambers can be achieved. The software may communicate with multiple chambers at different operations in the process. That is, the information collected from a certain operation can be fed forward or backward to a different operation to improve the process stability and to reduce variability.

By measuring the predicted wafer thickness using a QCM data, the data can flow forward to a later operation and be used to calculate endpoint time in the CMP operation. Real time 3D thickness wafer maps or any other metrology measurement for process chambers can be developed by the method and system of the present disclosure. The QCM system will first "learn" the correlation factors of the QCM sensors data to the wafer thickness (or any other metrology measurement) at each X/Y location over the wafer. This can be done by using thickness metrology maps of external standalone metrology equipment (or other in situ metrology) to "train" the QCM sensors by using the correlation of the QCM sensors data at different locations (or/and angles) in the process chamber to different X/Y locations (coordinate) over the wafer. Based on the correlation factors, the wafer thickness, stress map or other measurements of interest can be derived by the QCM sensors system data in real-time.

The method may also include the steps of providing multiple QCM sensors inside a process chamber and running a process monitor, which can monitor material thickness over the deposition chamber while recording the QCM data. The wafer thickness can be measured by an external metrology tool for multiple locations over the substrate or wafer. A statistical model may be developed using the QCM data or mathematical transformation of the QCM data as input to the substrate thickness profile data (or to mathematical transformation of this data) at different locations over the substrate or wafer as output. Based on the data calculated, a 3-dimensional (X/Y location Z=thickness) surface profile can be developed using the QCM data in real time. Finally, the substrate thickness profile or other metrology measurement can be imported automatically to the QCM sensors system and the QCM data can be optimized automatically.

Figure 3A:
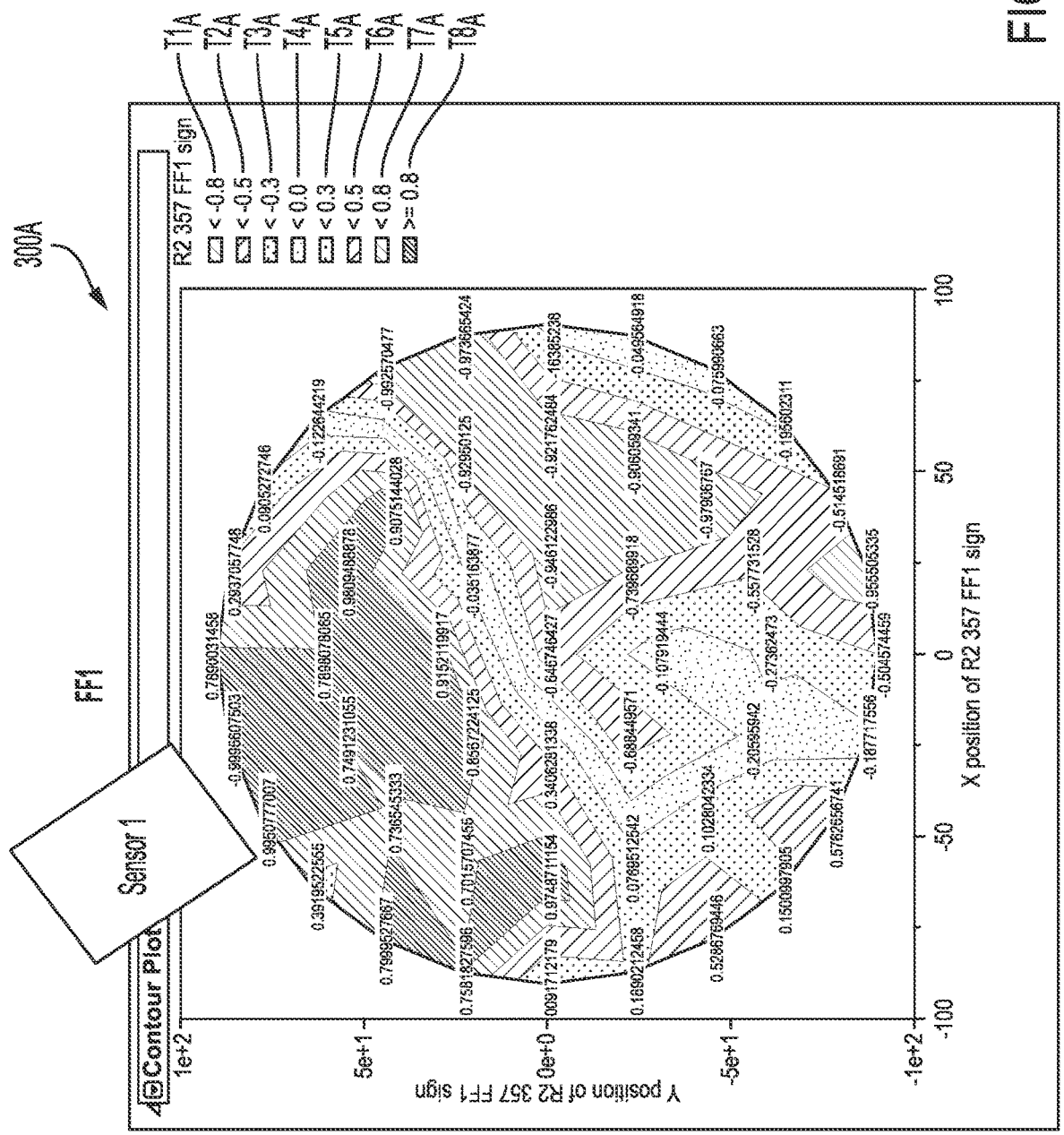
FIGS. 3A and 3B depict correlation maps of measurements taken from a wafer by two QCM sensors at different locations of the process chamber of FIG. 1.
Figure 3B:
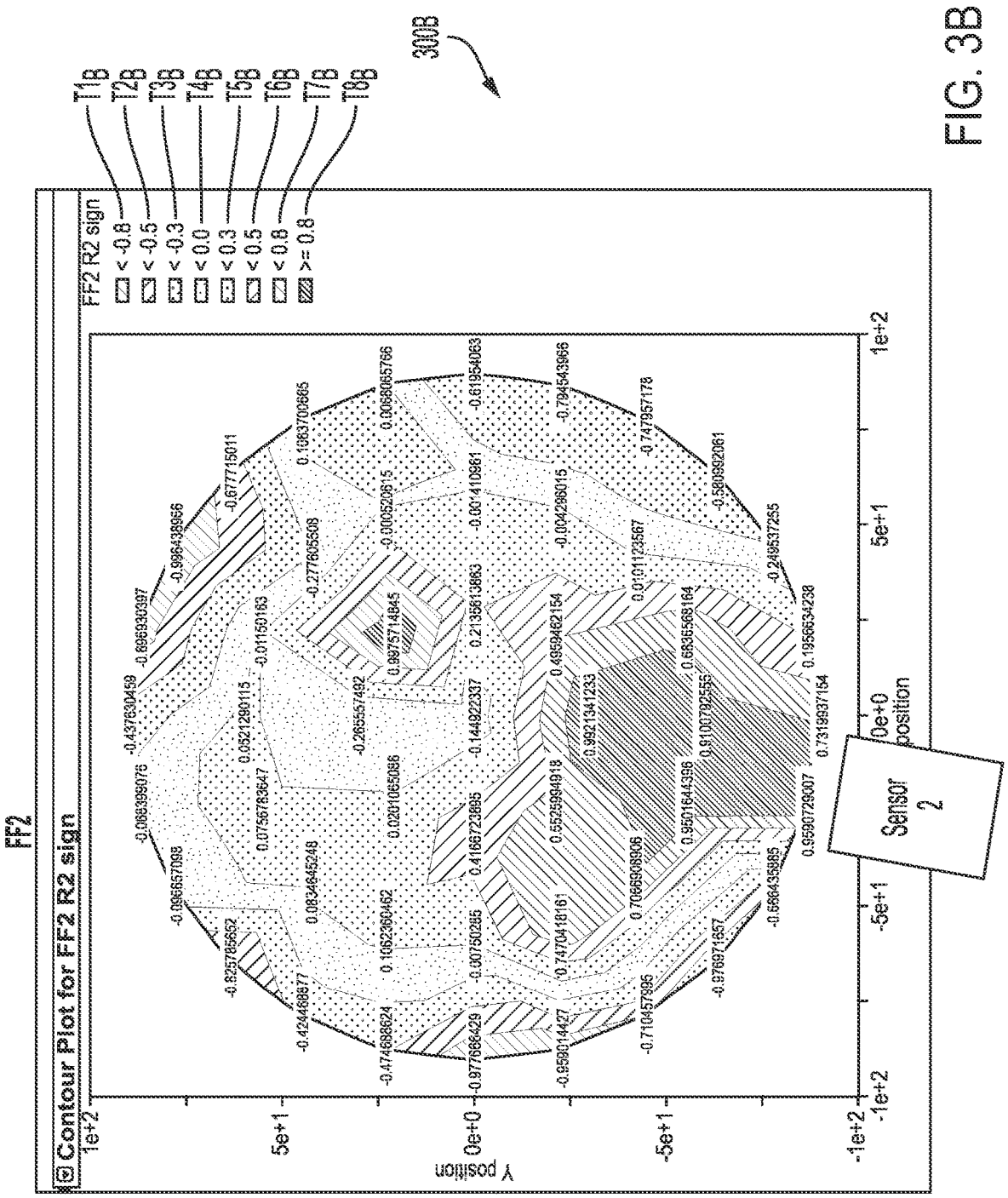

FIGS. 3A & 3B depict correlation maps between two QCM sensors at different locations over the process chamber of FIG. 1. For instance, FIGS. 3A & 3B show 49 location thickness maps measured by an external metrology tool, to determine which regions correlate strongly with the QCM sensor's results. FF1 represents sensor 1 and FF2 represents sensor 2. Certain regions represent strong correlations while others represent weaker correlations.

FIG. 3A shows a correlation map where a QCM sensor S1, has been located at roughly an 11 o'clock position with respect to the substrate or wafer. FIG. 3B shows a correlation map where a QCM sensor S2 has been located at roughly a 6 o'clock position with respect to the substrate or wafer. Thus, if data is combined with respect to the at least two sensors S1, S2, a better understanding of the thickness profile of the substrate or wafer can be determined. For example, a weighted average of the sensor data can be used, wherein the closer the sensor is to a region of interest, the more weight may be given to that sensor. Although this specific example uses a QCM sensor, a MEM sensor could be used in the same manner.

It may be possible to obtain higher correlation factors (between X/Y location thickness data to the sensors data) between adjacent sensors to X/Y location over the wafer. For example, Sensor S1 represents a higher correlation to thickness data when positioned near the sensor and the same for sensor S2. The multiple-QCM system used can be either of same crystallographic cut or a combination of different cuts selected to minimize the impact of temperature or pressure depending on the location of a given QCM sensor.

The selection of the QCM-type is based on process steps as well, inasmuch as there can be more than one cut in the same location for different process steps. The QCM sensors can be rigidly mounted to the chamber or allowed to dynamically extend, retract, tilt or/and rotate (using a motor) to capture different process conditions (mass removal, mass deposition, densification, temperature, pressure, film stress) at different angles and different positions in the process chamber.

The use of dynamically adjusting in situ the QCM sensors positions and angles during different process sequences will allow measuring and possibly control different process/process rates conditions or end points at different parts of the chamber, as well as monitoring and/or control different process sequences for different angles and positions in the wafer plan.

One or more embodiments described above may also be modified as follows. For example, in some embodiments, the QCM (or MEM) sensors may use one or more of the power supplies: wired power supply, wireless power charging, battery, capacitor or so called super capacitor or any other thermoelectric source. In addition, in other embodiments, the signals transmission from the QCM sensors the signals may be transmitted through a wire or in any other wireless method like Bluetooth or RF.

The correlation methodology between, for example, a circular substrate and a cylindrical process chamber may be performed in the following manner. In this example, a cylindrical process chamber may be divided into eight (8) or more sectors each having a substantially pie-shaped geometry, i.e., two radii emanating from a center of the chamber, an outer arc of the cylindrical inner wall of the process chamber and a vertical height. For each sector, a QCM or MEM sensor is placed at a predefined location within the sector to acquire a sensed value of the mass accumulated on the sensor. The signal provided by the QCM sensor is a change in frequency or delta frequency value which is indicattived of the accumulated mass valve. If the circular substrate is centrally located within the process chamber, eight sectors will define eight pie-shaped areas.

Any process parameter of interest, such as a thickness value, may be defined for each area of the substrate and denoted as thickness values T1-T8. The value of the sensor readings S1-S8 may then be mathematically related to the thickness value T1-T8 by a mathematical equation in the form $T_i = F(f_{S1}, \ldots, f_{S8})$, where $f_{si}$ is a function of sensor values S1-S8, and F is a function of all of the $f_{si}$. As would be appreciated by a person of ordinary skill in the art, the function F could then be represented by an 8×8 matrix which correlates each of the sensor values to the thickness values of the substrate. This correlation takes the form $T=C(f)$, where T is an vector of the eight thickness values T1-T8, C is an 8×8 matrix of constants, and f is a vector of the sensor values. S1-S8.

The Applicant discovered that the C-matrix is time invariant for a given set of process parameters, such as pressure, flow, plasma power, etc. Hence, one or more calibration runs can be performed to determine the C matrix at a particular time. The values of the C matrix can, thereafter, be used to measure process parameters for subsequent runs of the process. For example, a calibration or baseline wafer substrate can be exposed to a given process recipe in the chamber with the eight sensors positioned as described above. Thereafter, the calibration wafer can be measured using any of a variety of techniques, such as ellipsometry. From these measurements, the C matrix can be determined Subsequent runs of the process on production wafer substrates can be periodically checked for adherence to design tolerances using the matrix equation above to determine the process parameter, such as thickness.

Additional embodiments include any one of the embodiments described above, where one or more of its components, functionalities or structures is interchanged with, replaced by or augmented by one or more of the components, functionalities or structures of a different embodiment described above.

It should be understood that various changes and modifications to the embodiments described herein will be apparent to those skilled in the art. Such changes and modifications can be made without departing from the spirit and scope of the present disclosure and without diminishing its intended advantages. It is therefore intended that such changes and modifications be covered by the appended claims.

Although several embodiments of the disclosure have been disclosed in the foregoing specification, it is understood by those skilled in the art that many modifications and other embodiments of the disclosure will come to mind to which the disclosure pertains, having the benefit of the teaching presented in the foregoing description and associated drawings. It is thus understood that the disclosure is not limited to the specific embodiments disclosed herein above, and that many modifications and other embodiments are intended to be included within the scope of the appended claims. Moreover, although specific terms are employed herein, as well as in the claims which follow, they are used only in a generic and descriptive sense, and not for the purposes of limiting the present disclosure, nor the claims which follow.

What is claimed is:

1. A system for monitoring a semiconductor processes, comprising:
   a plurality of sensors selectively arranged within a process chamber and configured to issue process signals indicative of a material process occurring proximal to each of the plurality of sensors, the plurality of sensors comprising,
      a first sensor defining a first spatial position within the process chamber, and
      a second sensor defining a second spatial position within the process chamber, the first spatial position having a different angular orientation than the second spatial position; and,
   a microcontroller configured to:
      receive the process signals,
      correlate the material process sensed by the first and second sensors with a semiconductor process occurring within a current process chamber to acquire information useful for conducting semiconductor processes, and
      modify, in real-time, a parameter of the semiconductor process based on the process signals.

2. The system of claim 1 wherein the semiconductor process pertains to a deposition or removal process from a substrate.

3. The system of claim 1 wherein the semiconductor process pertains to a material thickness profile of a substrate.

4. The system of claim 3 wherein the microcontroller determines a uniformity of the material thickness profile.

5. The system of claim 1 wherein process signals issued by at least two sensors are correlated to acquire information regarding semiconductor processes occurring in a region between the at least two sensors.

6. The system of claim 1 wherein the plurality of sensors are disposed about an edge of a substrate and wherein the microcontroller controls a semiconductor process to maintain substrate edge uniformity.

7. The system of claim 1 wherein a substrate within the process chamber defines a two dimensional plane, wherein the first and second sensors each have a different angular orientation with respect to the two dimensional plane, and wherein the microcontroller develops three dimensional, thickness profile data in connection with the substrate.

8. The system of claim 1, wherein the plurality of sensors comprise Quartz Crystal Microbalance (QCM) sensors.

9. The system of claim 1, wherein the plurality of sensors comprise microelectromechanical (MEM) sensors.

10. The system of claim 1, wherein the plurality of sensors comprise one or more of Quartz Crystal Microbalance (QCM) sensors and microelectromechanical (MEM) sensors.

11. A system for monitoring a semiconductor process, the system comprising:
   a plurality of sensors disposed within a process chamber, the plurality of sensors being configured to monitor a deposition or a removal process at different locations within the process chamber, wherein a first sensor of the plurality of sensors has a first angular orientation and a first position in the process chamber and a second sensor of the plurality of sensors has a second angular orientation and second position in the process chamber; and
   a microcontroller configured to receive data from the plurality of sensors, wherein the microcontroller configured to measure uniformity of the semiconductor process based on the data received from the plurality of sensors, and modify a parameter of the semiconductor process in real-time based on the data received from the first and second sensor,
   wherein the first angular orientation and first position of the first sensor and the second angular orientation and second position of the second sensor facilitates measuring the uniformity of the semiconductor processes.

12. The system of claim 11, wherein the plurality of sensors comprises Quartz Crystal Microbalance (QCM) sensors.

13. The system of claim 11, wherein the plurality of sensors comprise microelectromechanical (MEM) sensors.

14. The system of claim 11, wherein the plurality of sensors comprise one or more of Quartz Crystal Microbalance (QCM) sensors and microelectromechanical (MEM) sensors, and wherein:
   a substrate within the process chamber defines a two dimensional plane;

the first and second sensors each have a different angular orientation with respect to the two dimensional plane; and the microcontroller develops three dimensional, thickness profile data in connection with the substrate.

15. The system of claim 11, wherein the semiconductor process is a material deposition process and the microcontroller measures uniformity of material deposition in the chamber.

16. The system of claim 11, wherein the semiconductor process comprises a material deposition process and the microcontroller measures a material thickness in the chamber.

17. The system of claim 11, wherein the semiconductor process comprises a material removal process and the microcontroller measures uniformity of material removal in the chamber.

18. The system of claim 11, wherein the semiconductor process comprises a material removal process and the microcontroller measures a material thickness in the chamber.

19. A method for monitoring a semiconductor process, the method comprising:
providing a plurality of sensors within a process chamber, the plurality of sensors including,
a first sensor of the plurality of sensors having a first angular orientation and a first position in the process chamber, and
a second sensor of the plurality of sensors having a second angular orientation and second position in the process chamber;
monitoring a deposition or a removal process at different locations within the process chamber;
measuring uniformity of the semiconductor process based on data received from the plurality of sensors during the monitoring step, wherein the first angular orientation and first position of the first sensor and the second angular orientation and second position of the second sensor facilitates measuring the uniformity of the semiconductor processes; and
modifying a parameter of the semiconductor process in real-time based on the data received from the first and second sensor.

20. The method of claim 19, wherein the plurality of sensors comprise a plurality of Quartz Crystal Microbalance (QCM) sensors.

21. The method of claim 19, wherein the plurality of sensors comprises microelectromechanical (MEM) sensors.

22. The method of claim 19, wherein the plurality of sensors comprise one or more of Quartz Crystal Microbalance (QCM) sensors and microelectromechanical (MEM) sensors, and wherein:
a substrate within the process chamber defines a two dimensional plane;
the first and second sensors each have a different angular orientation with respect to the two dimensional plane; and
the microcontroller develops three dimensional, thickness profile data in connection with the substrate.

23. The method of claim 19, wherein the semiconductor process is a material deposition process and the microcontroller measures uniformity of material deposition in the chamber.

24. The method of claim 19, wherein the semiconductor process is a material deposition process and the microcontroller measures a material thickness in the chamber.

25. The method of claim 19, wherein the semiconductor process is a material removal process and the microcontroller measures uniformity of material removal in the chamber.

26. The method of claim 19, wherein the semiconductor process is a material removal process and the microcontroller measures a material thickness in the chamber.

* * * * *